(12) United States Patent
Ferriss et al.

(10) Patent No.: US 9,157,950 B2
(45) Date of Patent: Oct. 13, 2015

(54) LOOP PARAMETER SENSOR USING REPETITIVE PHASE ERRORS

(75) Inventors: Mark Ferriss, Tarrytown, NY (US); Arun S. Natarajan, White Plains, NY (US); Benjamin D. Parker, Peekskill, NY (US); Alexander V. Rylyakov, Mount Kisco, NY (US); Jose A. Tierno, Stamford, CT (US); Soner Yaldiz, Pittsburgh, PA (US)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 13/088,949

(22) Filed: Apr. 18, 2011

(65) Prior Publication Data

US 2012/0262149 A1 Oct. 18, 2012

(51) Int. Cl.
| | |
|---|---|
| G01R 25/00 | (2006.01) |
| G01R 31/28 | (2006.01) |
| H03L 7/093 | (2006.01) |
| H03L 7/107 | (2006.01) |
| H03L 7/18 | (2006.01) |

(52) U.S. Cl.
CPC ............ *G01R 31/2824* (2013.01); *H03L 7/093* (2013.01); *H03L 7/1075* (2013.01); *H03L 7/1077* (2013.01); *H03L 7/18* (2013.01); *H03L 2207/06* (2013.01)

(58) Field of Classification Search
USPC .............. 324/76.53, 76.68, 87; 327/156, 158, 327/157; 331/17, 44
See application file for complete search history.

(56) References Cited

U.S. PATENT DOCUMENTS

| 4,654,861 | A | * | 3/1987 | Godard ........................ 375/226 |
|---|---|---|---|---|
| 5,596,300 | A | * | 1/1997 | Dietrich et al. ................. 331/17 |
| 5,889,435 | A | | 3/1999 | Smith et al. |
| 6,160,860 | A | * | 12/2000 | Larsson ........................ 375/376 |
| 6,262,634 | B1 | * | 7/2001 | Flanagan et al. ................ 331/25 |
| 6,360,163 | B1 | | 3/2002 | Cho et al. |
| 7,092,856 | B1 | | 8/2006 | Hojo et al. |
| 7,095,287 | B2 | | 8/2006 | Maxim et al. |

(Continued)

OTHER PUBLICATIONS

Fishette, D.M. et al., "An Embedded All-Digital Circuit to Measure PLL Response", IEEE Journal of Solid-State Circuits, 45(8), 1492-1503. DOI: 10.1109/JSSC.2010.2048143. Aug. 2010.

(Continued)

*Primary Examiner* — Thomas F Valone
(74) *Attorney, Agent, or Firm* — Scully, Scott, Murphy & Presser, P.C.; Anne V. Dougherty, Esq.

(57) ABSTRACT

A method and system are disclosed for measuring a specified parameter in a phase-locked loop frequency synthesizer (PLL). In one embodiment, the method comprises introducing multiple phase errors in the PLL, measuring a specified aspect of the introduced phase errors, and determining a value for the specified parameter using the measured aspects of the introduced phase errors. In one embodiment, the phase errors are introduced repetitively in the PLL, and these phase errors produce a modified phase difference between the reference signal and the feedback signal in the PPL. In one embodiment, crossover times, when this modified phase difference crosses over a preset value, are determined, and these crossover times are used to determine the value for the specified parameter. In an embodiment, the parameter is calculated as a mathematical function of the crossover times. The parameter may be, for example, the bandwidth of the PLL.

21 Claims, 6 Drawing Sheets

REPETITIVE INTRODUCTION OF PHASE ERROR.tc1, tc2..
AT SUCCESSIVE CROSSOVER TIMES.

(56) References Cited

U.S. PATENT DOCUMENTS

| | | |
|---|---|---|
| 7,102,401 B2 | 9/2006 | Galloway |
| 7,403,073 B2 | 7/2008 | Kossel et al. |
| 7,411,463 B2 | 8/2008 | Tanis |
| 7,551,677 B2 | 6/2009 | Crawford |
| 2001/0035781 A1* | 11/2001 | Vaucher et al. ............... 327/117 |
| 2005/0052251 A1* | 3/2005 | Jensen et al. .................... 331/25 |
| 2008/0164918 A1 | 7/2008 | Stockstad et al. |
| 2013/0027096 A1 | 1/2013 | Pialis et al. |
| 2013/0027097 A1 | 1/2013 | Wang et al. |
| 2013/0027098 A1 | 1/2013 | Wang et al. |
| 2013/0027099 A1 | 1/2013 | Wang et al. |
| 2013/0027100 A1 | 1/2013 | Yaghini et al. |

OTHER PUBLICATIONS

Roche, J. et al. "50-MHz phase locked loop with adaptive bandwidth for jitter reduction", International Conference on Microelectronics, ICM 2007, 291-294, DOI: 10.1109/ICM.2007.4497713. Dec. 2007.

* cited by examiner

EXAMPLE OF PHASE TRANSFER FUNCTION

VCO GAIN VARIATION ACROSS CONTROL VOLTAGE

VARIATION IN PHASE TRANSFER FUNCTION DUE TO VARIATION IN LOOP PARAMETERS

OVERSHOOT AND CROSSOVER TIME AFTER PHASE ERROR INTRODUCTION

REPETITIVE INTRODUCTION OF PHASE ERROR.tc1, tc2..
AT SUCCESSIVE CROSSOVER TIMES.

REPETITIVE APERIODIC INTRODUCTION OF PHASE ERROR.tc1, tc2..
AT SUCCESSIVE CROSSOVER TIMES.

LOOP PARAMETER SENSOR USING REPETITIVE PHASE ERRORS

STATEMENT OF GOVERNMENT INTEREST

This invention was made with Government support under Contract No.: FA8650-090-C-7924 Defense Advanced Research Projects Agency (DARPA). The Government has certain rights in this invention.

BACKGROUND OF THE INVENTION

Field of the Invention

This invention generally relates to phase-locked loop frequency synthesizers, and more specifically, to measuring parameters of phase-locked loop frequency synthesizers.

Phase-locked loop frequency synthesizers, generally referred to as phase-locked loops or PLLs, are devices that generates an output signal with a frequency that is a function of a reference input signal. PLLs are used in many systems such as data processing systems, communication systems, and audio and video processing systems. When a PLL is implemented in a system, the frequency of the output signal of the PLL may change many times. For example, the frequency of this output signal may change at the start-up of the system, or when the system changes from one channel to another.

The PLL may include certain components connected in a feedback loop. For example, the PLL may include a voltage controlled oscillator (VCO), a phase frequency detector (PFD) and a loop filter. The PLL may additionally include a feedback frequency divider in applications where the VCO frequency is designed to be a multiple of the reference frequency.

The PFD may control the frequency of the output signal of the VCO. The PFD in the PLL receives the output signal in the feedback loop and compares the frequency of the output signal to the frequency of the reference signal. Based on the comparison of the frequency of the output signal to the frequency of the reference signal, the PFD generates a control signal that is provided to a low-pass filter and then to the VCO in order to control the frequency of the output signal of the VCO.

The absolute values of the components that are part of a PLL often depend upon temperature and supply voltage. Furthermore, these values can also vary due to manufacturing tolerances. For example, the time constants and settling behavior of a PLL are dependent on physical elements such as resistors and capacitors that may have a significant variation over process, temperature and supply voltage. In addition, in variable output frequency synthesizers, the natural frequency, loop bandwidth, and damping factor are dependent on the feedback divider modulus as well as the frequency of operation.

Consequently, in many systems it is desirable to measure PLL parameters in order to ensure that they are within specifications, for e.g., peaking is lower than a desired value, or bandwidth is set to a desired value. Also, it is desirable that this measurement be performed without unduly affecting the operation of the phase-locked loop. If the loop has to be opened for this measurement, the voltage-controlled oscillator is in open-loop mode and therefore its frequency/phase are no longer controlled by the reference signal. Most systems incorporating a PLL cannot operate with the VCO unlocked. Therefore, the entire system does not function during the PLL measurement cycle and must wait for the loop to be closed and attain lock in order to resume functioning, which is clearly undesirable.

BRIEF SUMMARY

Embodiments of the invention provide a method and system for measuring a specified parameter in a phase-locked loop frequency synthesizer (PLL). In one embodiment, the method comprises introducing multiple phase errors in the PLL, measuring a specified aspect of the introduced phase errors, and determining a value for the specified parameter using said measured aspects of the introduced phase errors.

In one embodiment, said phase errors are introduced repetitively in the PLL. For example, the phase errors may be introduced in the PLL at regular periods, or the phase errors may be introduced aperiodically at known time intervals.

In an embodiment, the multiple phase errors are introduced in the PLL to produce a modified phase difference between the reference signal and the feedback signal in the PPL.

In one embodiment, the crossover times, when said modified phase difference crosses over a zero phase difference value, are determined, and these crossover times are used to determine the value for the specified parameter. In an embodiment, said parameter is calculated as a mathematical function of said crossover times.

In an embodiment, over a given time period, one of the phase errors is introduced in the PLL a specified waiting time after each of the crossover time in said given period of time.

In one embodiment, the multiple phase errors include phases having opposite polarities to overcome offsets in measurement of the phase difference between the reference and feedback signals.

DETAILED DESCRIPTION

Figure 1:
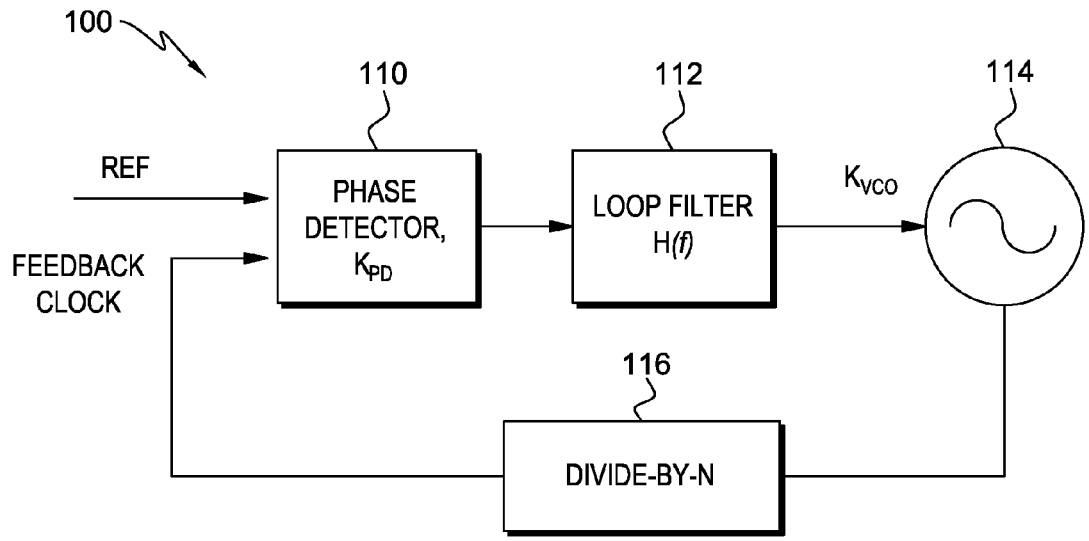
FIG. 1 is a block diagram illustrating one embodiment of a phase-locked loop frequency synthesizer.

FIG. 1 is a block diagram of a basic PLL 100, including a phase detector 110, a loop filter 112, a VCO 114, and a divider 116. The phase detector 110 compares the phase of the output signal of the VCO 114 with the phase of the reference signal, i.e., the input signal to the phase detector 110. The phase detector 110 develops an output signal that is approximately proportional to the phase error (the phase error being the phase difference between the reference signal and the output signal of the VCO 114). The output signal of the phase detector 110 is made up of the dc component and a superimposed ac component; because the ac component is undesired, it is attenuated by the loop filter 112. The loop filter 112 responds to phase error indications from the phase detector 110 by "steering" the VCO 114 frequency higher or lower, thereby keeping the output of the VCO 114 locked in frequency and phase with respect to the reference signal. The VCO 114 is a voltage-controlled oscillator that has a voltage input and a frequency output. The frequency at the output of the VCO 114 is proportional to the voltage provided at the input within some specified frequency range. Of course, PLLs are not limited to this construction, and variations, modifications, and additions are often implemented by persons having ordinary skill in the art.

Dynamic analysis of a control system is usually performed using the transfer function, which is a mathematical representation of the relationship between the input signal and output signal of the system. Two notable characteristics specifying a PLL's dynamic behavior, for example, are the −3 dB cutoff frequency and the damping factor of the loop.

In general terms, the cutoff frequency of a circuit (for example a filter) is the frequency either above which or below which the power output of the filter is reduced to half of the passband power, that is, the half-power point. This is equivalent to an amplitude reduction to 70.7% of the passband, and happens to be close to −3 decibels. Thus, the cutoff frequency is frequently referred to as the −3 dB point.

Figure 2:
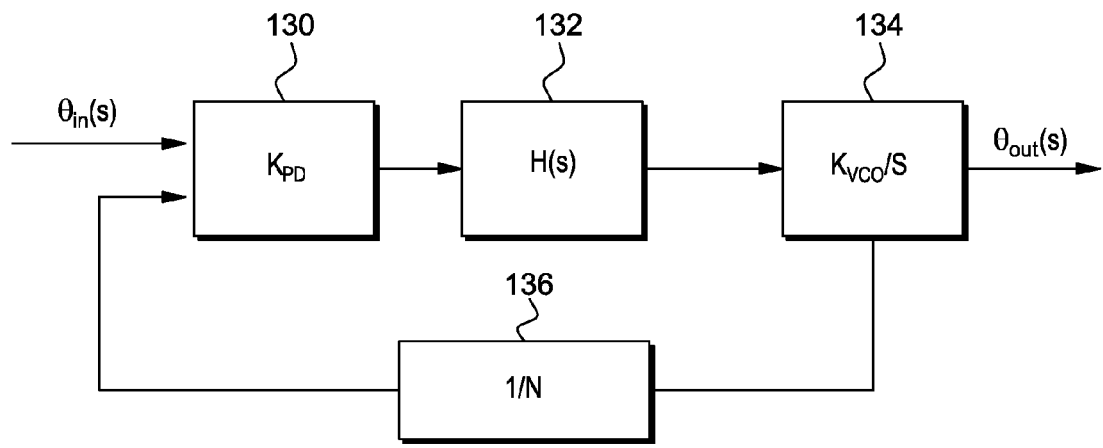
FIG. 2 shows a linearized phase model of the PLL of FIG. 1.

For example, the response of the PLL to small phase errors at the input, is given in the frequency domain by the PLL phase transfer function, based on the linearized phase model shown in FIG. 2. In FIG. 2, the responses of the phase detector and the loop filter are represented at 130 and 132 respectively. The response of the VCO is represented at 134, and the response of the divider 116 is represented at 136. The equation for the transfer function of the loop shown in FIG. 2 is given by, $$\frac{\theta_{out}(s)}{\theta_{in}(s)} = \frac{K_{PD}H(s)K_{VCO}}{s + \frac{K_{PD}H(s)K_{VCO}}{N}} \quad (1)$$

It may be noted that the model in FIG. 2 and equation (1) are small signal models for the PLL and are valid for small phase errors. Some loop components such as $K_{vco}$, can be non-linear and therefore measurements that introduce large phase errors and then measure settling time do not provide the same results as measurements that introduce small phase errors.

Figure 3:
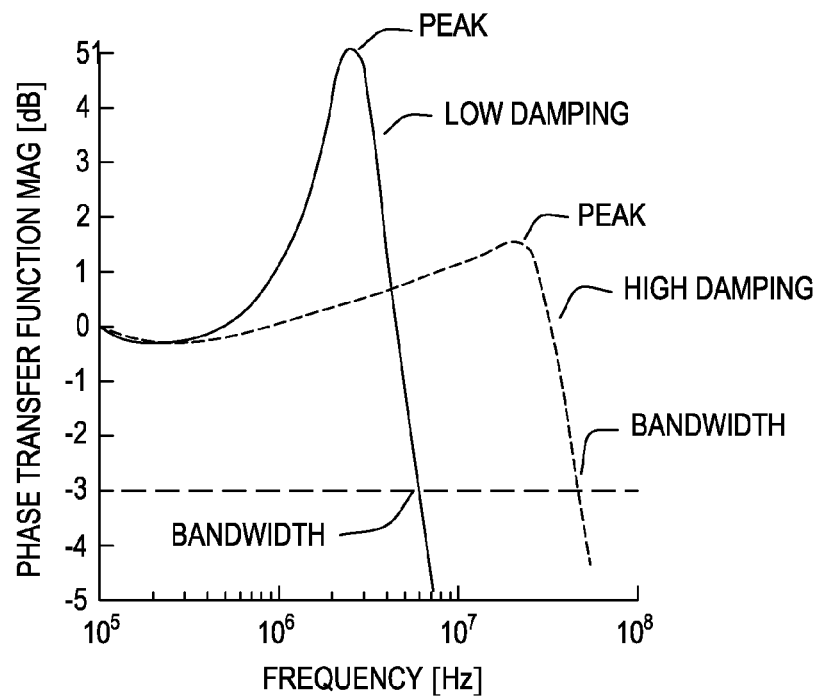
FIG. 3 shows three example PLL transfer functions.

FIG. 3 shows three example PLL transfer functions. The PLL phase transfer function is governed by PLL topology, number of poles and zeros, and values of loop components such as charge pump current, loop capacitor, VCO frequency gain ($K_{vco}$). Often, the w3 dB and peaking are used to characterize the loop transfer function. For several applications, a specific value of w3 dB and peaking must be achieved for desired system behavior. For example, PLLs in wireline communications must typically have low peaking, and PLLs used in wireless links set the loop bandwidth based on ratio of reference phase noise and open-loop VCO phase noise.

Figure 4:
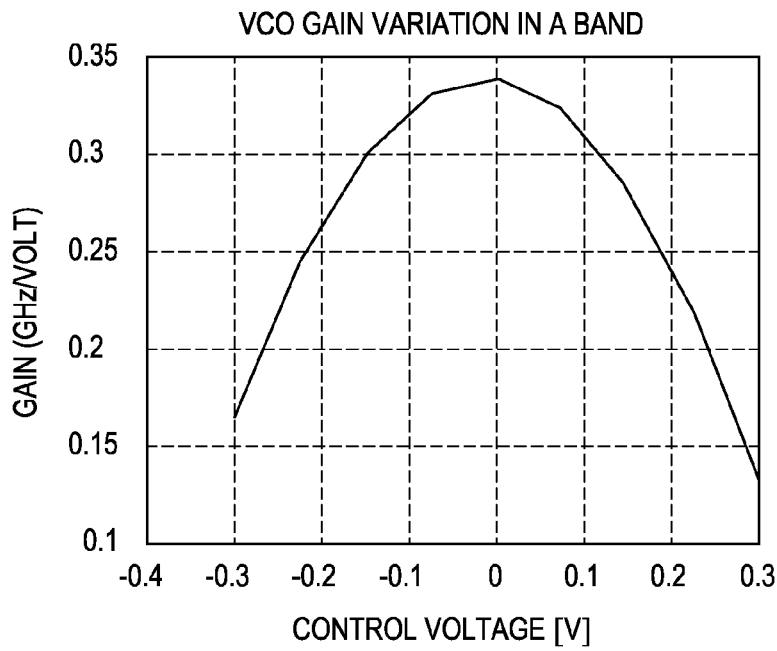
FIG. 4 illustrates the VCO gain, $K_{vco}$, as a function of control voltage in a PLL.
Figure 5:
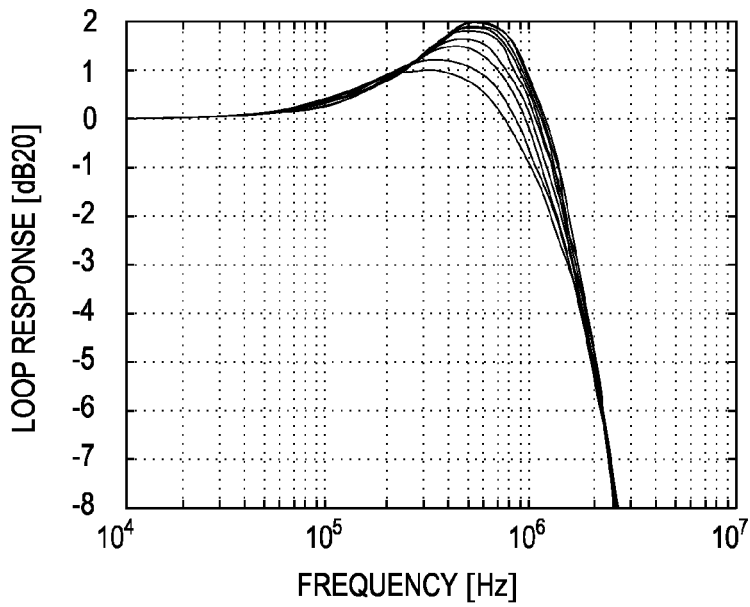
FIG. 5 shows the variation in PLL phase transfer response due to the VCO gain variation shown in FIG. 4.

As mentioned above, the absolute values of the components that are part of loop often depend upon temperature and supply voltage. Furthermore, these values can also vary due to manufacturing tolerances. As a result, the phase transfer function, which depends upon the absolute values of these parameters, also exhibits significant variation. FIG. 4 shows the VCO gain, $K_{vco}$, as a function of control voltage across the variable capacitors that provide frequency tuning. FIG. 5 shows the variation in PLL phase transfer response due to this VCO variation.

Due to these variations in the phase transfer function, it is desirable in many systems to measure PLL phase transfer function in order to ensure that it is within specifications, for e.g., peaking is lower than desired value, or bandwidth is set to desired value. Furthermore, it is desirable that this measurement be performed without unduly affecting the operation of the phase-locked loop. If the loop has to be opened for this measurement, the voltage-controlled oscillator is in open-loop mode and therefore its frequency/phase are no longer controlled by the reference signal. Most systems incorporating a PLL cannot operate with the VCO unlocked. Therefore, the entire system does not function during the PLL measurement cycle and must wait for the loop to be closed and attain lock in order to resume functioning, which is clearly undesirable.

Embodiments of the invention achieve a PLL measurement that is accurate and ensures that the PLL does not need to be unlocked for the loop parameter measurement. Generally, this is done by introducing phase error repetitively in the PLL and measuring successive crossover times—that is, the times at which the difference between the reference and feedback clocks is zero. These phase errors are repetitively introduced before the PLL has recovered completely from previously introduced errors, and the crossover times are thus a function of the loop parameters and the times at which the phase errors are introduced. The loop parameters, such as w3 dB and damping ratio, can be calculated from successive crossover times, by using a mathematic model that translates the successive crossover times to specific loop parameters. For example, a training set of known loop parameters is used to build a polynomial function that uses the crossover times as input and provides w3 dB as the output.

Figure 6:
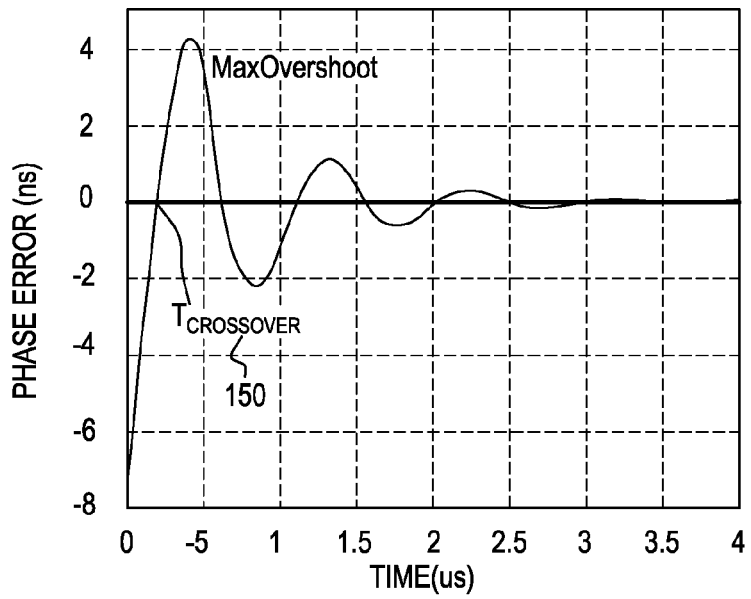
FIG. 6 illustrates overshoot and a crossover time of a phase difference, in an embodiment of the invention, after a phase error introduction.
Figure 7:
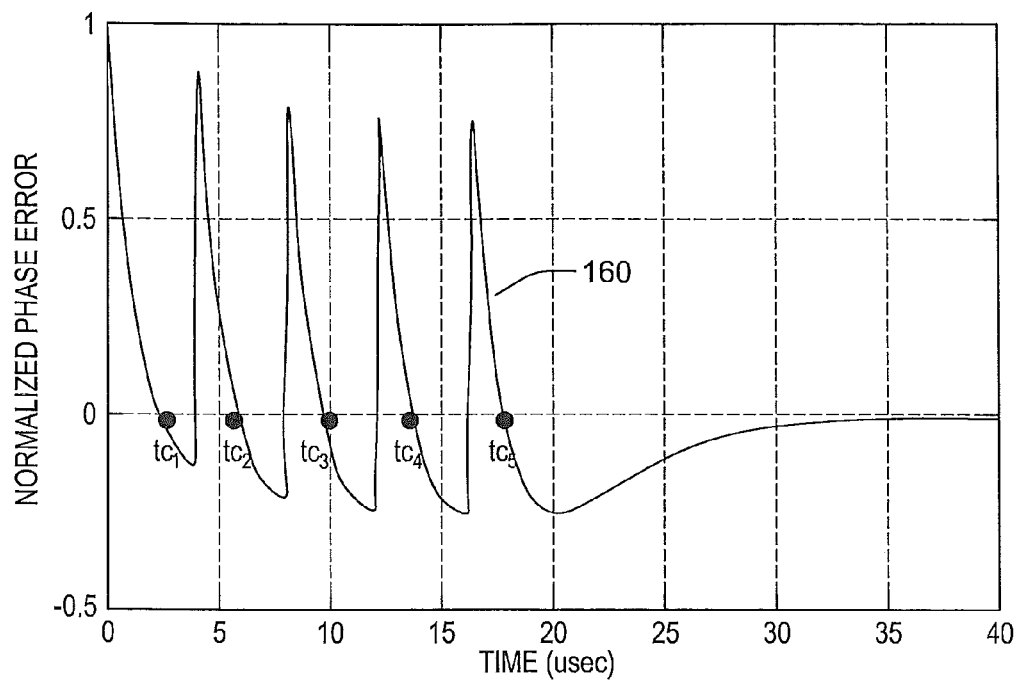
FIG. 7 shows a repetitive phase error introduction and successive crossover times.

FIGS. 6 and 7 illustrate aspects of this procedure. In particular, FIG. 6 shows a crossover time, and FIG. 7 illustrates the repetitive introduction of the phase errors and successive crossover times. With reference to FIG. 6, after a phase error is introduces, the difference between the reference and clock signals fluctuates between positive and negative values and would eventually reach zero level. The crossover time 150 is, in embodiments of the invention, considered as the first time after a phase error is introduced, when the phase difference crosses over a present value, which may be zero.

FIG. 7 shows the normalized phase error 160, over time, with the phase error repetitively introduced. After each time a phase error is introduced, the normalized phase error decreases, crosses a zero value, and then increases before the next phase error is introduced.

Figure 8:
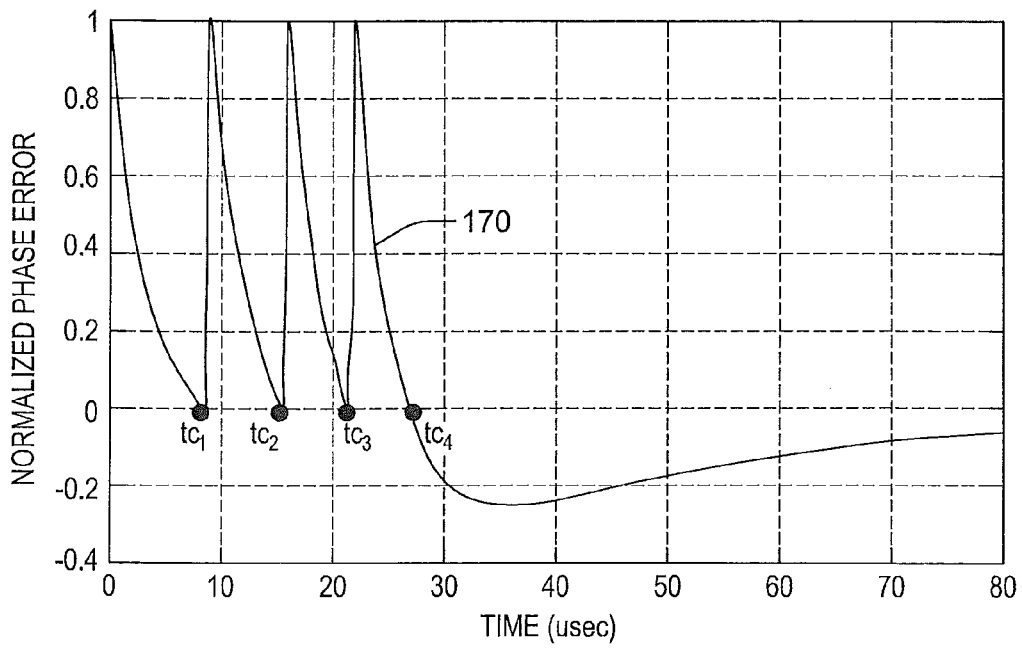
FIG. 8 illustrates the result of a repetitive aperiodic introduction of phase error in an embodiment of the invention.

In this embodiment, since the phase errors are repetitively introduced before the PLL has recovered completely from previous errors, the crossover times $tc_i$ are a function of the loop parameters and the times at which the phase errors are introduced. The phase errors can be introduced periodically as shown in FIG. 7 or as shown at 170 in FIG. 8, the errors can be introduced a fixed time after each zero crossing.

Figure 9:
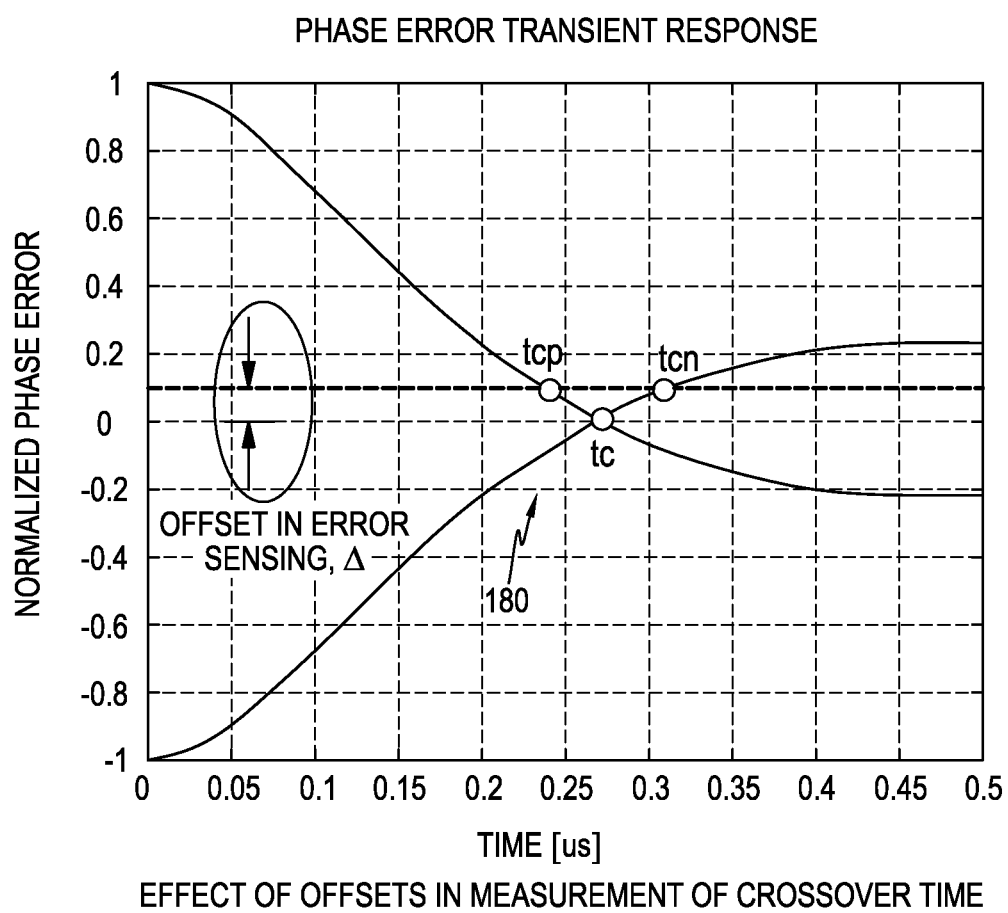
FIG. 9 shows the effect of offsets in measurement of crossover time.

Offsets in the phase error measurement itself can cause errors in the measured crossover times. As shown at 180 in FIG. 9, the real crossover time, tc, might not be measured accurately due to this measurement offset error. However, the impact of this offset can be reduced by using phase errors of both polarities. As shown in FIG. 9, tc can be calculated as a function of tcp and tcn, where tcp and tcn are the measured crossover time for positive and negative phase errors in the presence of a measurement offset error.

Figure 10:
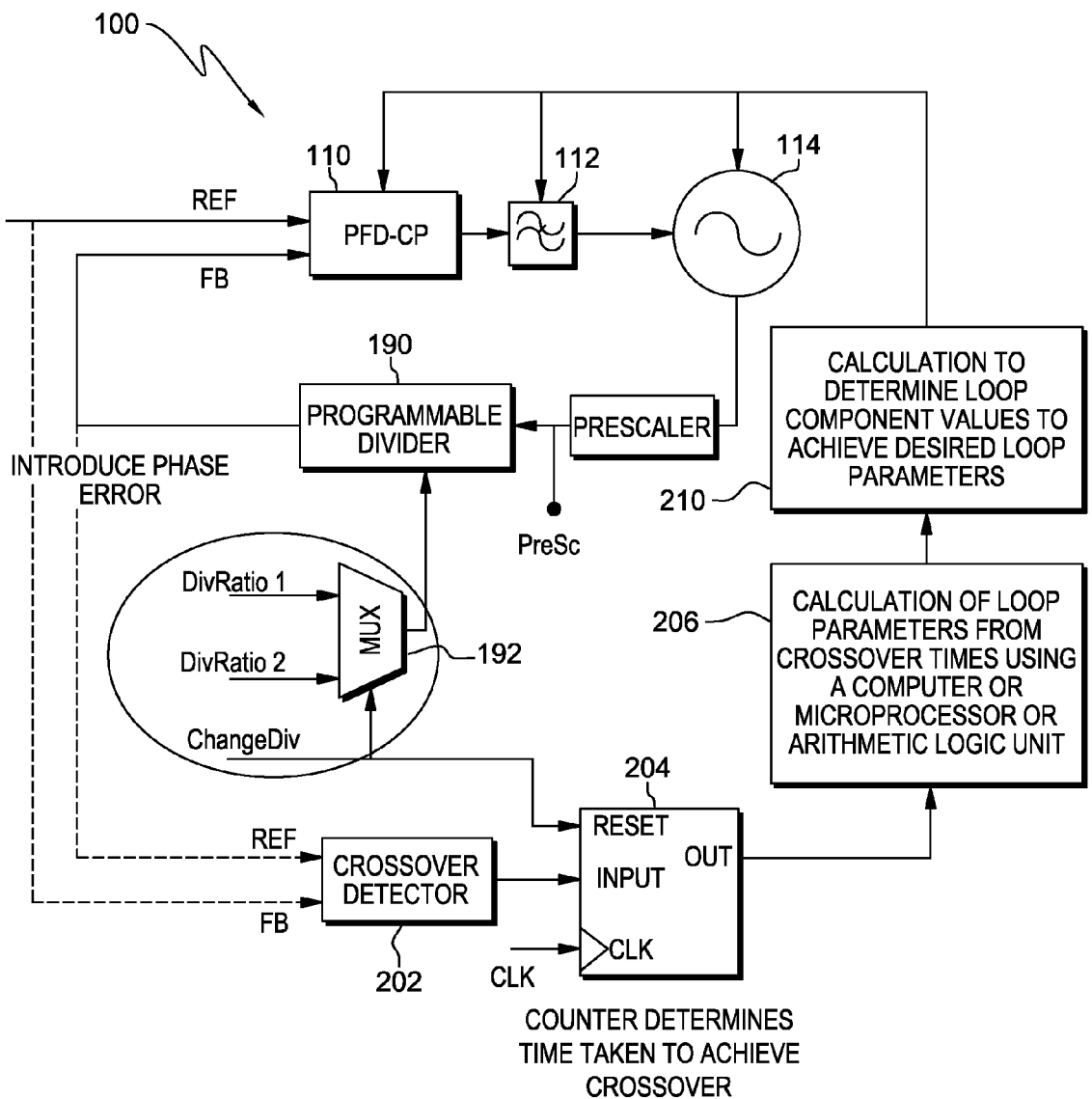
FIG. 10 depicts an arrangement for introducing phase error in a PLL and for calculating the loop parameters from the introduced phase errors.

The phase error can be introduced in the PLL in a variety of ways. For instance, in an embodiment, this phase error can be introduced by changing the delay of the reference signal. Also, with reference to FIG. 10, the phase error can be introduced in the PLL by changing the divide ratio. As represented in FIG. 10, this may be done by a programmable divide 190. For instance, in one embodiment, a multiplexer 192, under the control of changeDiv signal, may be used to select one of two, or more, divide ratios. Changing the divide ratio to a higher value and to a lower value results in phase errors with opposite polarities, which, as discussed above, can be used to correct for measurement offset.

FIG. 10 also illustrates one embodiment of a procedure for detecting the cross-over times, and for using the detected cross-over times to calculate one or more loop parameters. With the embodiment depicted in FIG. 10, cross-over detector 202 receives the feedback signal and the reference signal and detects each cross-over time. Counter 204 receives the output from cross-over detector and the ChangeDiv signal from the programmable divider 190; and counter 204 determines the time taken, after introduction of a phase error, to achieve the crossover. This time is used, as represented at 206, to calculate the loop parameter or parameters.

This calculation of the loop parameter or parameters may be done by any suitable device in any suitable way. For example, the calculation may be performed by on-chip circuitry—that is, by circuitry on the same processing chip as the LLP 100. Alternatively, the calculation may be performed by a separate computer, microprocessor or arithmetic logic unit.

As represented at 210, the calculated loop parameter or parameters may be used to determine loop component values—for example, values for the phase detector 110, the loop filter 112, or the VCO 114—to achieve the desired loop parameters. These values for the PLL components may be transmitted to the loop components themselves, and the PLL components may be adjusted or modified to operate with these values. Any suitable on-chip or off-chip procedure may be used at 210 to determine the loop component values needed to achieve the desired loop parameters.

While it is apparent that the invention herein disclosed is well calculated to achieve the features discussed above, it will be appreciated that numerous modifications and embodiments may be devised by those skilled in the art, and it is intended that the appended claims cover all such modifications and embodiments as fall within the true spirit and scope of the present invention.

The invention claimed is:

1. A method of measuring a specified parameter in a phase-locked loop frequency synthesizer (PLL), wherein a reference signal is compared to a feedback signal to determine a phase difference between the reference and feedback signals, the method comprising:
introducing multiple phase errors in the PLL between the reference and feedback signals over a period of time;
measuring the multiple phase errors between the reference signal and the feedback signal, including, for each of the phase errors, detecting a time when a phase error crossover time occurs, said phase error crossover time occurring when the phase error between the reference and feedback signals crosses over a preset value; and
determining a value for the specified parameter using the multitude of detected measurements of the phase error crossover times; and wherein:
the introducing multiple phase errors in the PLL includes introducing multiple phase errors having opposite polarities between the reference signal and the feedback signal,
the detecting a time when a phase error crossover time occurs includes using measurements of the crossover times of a plurality of the introduced phase errors having opposite polarities to overcome offsets in measurements of the phase difference between the reference and feedback signals; and
the introducing multiple phase errors having opposite polarities includes
alternating the polarities of successive ones of the multiple phase errors, including
using a programmable divide to apply a plurality of divide ratios to the feedback signal, and
applying a change divide ratio signal to a multiplexor to control the multiplexor to select alternate ones of the divide ratios for the programmable divide to apply to the feedback signal to alternate the polarities of successive ones of the multiple phase errors.

2. The method according to claim 1, wherein said phase errors are introduced repetitively in the PLL.

3. The method according to claim 1, wherein said parameter is calculated as a mathematical function of said crossover times.

4. The method according to claim 1, wherein:
the introducing multiple phase errors in the PLL includes, over a given time period, introducing a respective one of the phase errors in the PLL a specified waiting time after each of the crossover times in said given period of time.

5. The method according to claim 1, wherein the PLL comprises a plurality of components, and the method further comprises using said determined value to adjust operation of one or more of the components of the PLL.

6. The method according to claim 1, wherein the detecting a phase error crossover time includes:
receiving the reference signal and the feedback signal at a crossover detector, and using the received reference signal and the received feedback signal at the crossover detector to determine each phase error crossover time; and
receiving an output from the cross-over detector and the change divide ratio signal at a counter; and using the counter to determine for each of the phase errors, a time taken, after introduction of the phase error, to achieve a crossover when the phase error between the reference and feedback signals crosses over the preset value.

7. The method according to claim 2, wherein said phase errors are introduced in the PLL at regular periods.

8. The method according to claim 2, wherein said phase errors are introduced in the PLL at defined times.

9. A loop sensor using multiple phase errors in a phase-locked loop frequency synthesizer (PLL), wherein a reference signal is compared to a feedback signal to determine a phase difference between the reference and feedback signals, the loop sensor comprising:
a phase error source for introducing multiple phase errors in the PLL between the reference and feedback signals over a period of time; and
a phase error measuring unit for measuring the multiple phase errors between the reference signal and the feedback signal, including, for detecting for each of the phase errors, a time when a phase error crossover time occurs, said phase error crossover time occurring when the phase error between the reference and feedback signals crosses over a preset value; and wherein:

the introducing multiple phase errors in the PLL includes
introducing multiple phase errors having opposite
polarities between the reference signal and the feedback
signal,
the detecting a time when a phase error crossover time
occurs includes using measurements of the crossover
times of a plurality of the introduced phase errors having
opposite polarities to overcome offsets in measurements
of the phase difference between the reference and feedback signals; and
the introducing multiple phase errors having opposite
polarities includes
alternating the polarities of successive ones of the multiple
phase errors, including
using a programmable divide to apply a plurality of divide
ratios to the feedback signal, and
applying a change divide ratio signal to a multiplexor to
control the multiplexor to select alternate ones of the
divide ratios for the programmable divide to apply to the
feedback signal to alternate the polarities of successive
ones of the multiple phase errors.

10. The loop sensor according to claim 9, wherein the phase error source introduces said phase errors repetitively in the PLL.

11. The loop sensor according to claim 10, wherein said phase error source introduces said phase errors in the PLL at defined times.

12. The loop sensor according to claim 10, wherein said phase error source introduces said phase errors in the PLL at regular periods.

13. A method of measuring a specified parameter in a phase-locked loop frequency synthesizer (PLL), wherein, in said PLL, a reference signal is compared to a feedback signal to determine phase differences between said reference and feedback signals, the method comprising:
introducing multiple phase errors in said phase differences
between the reference and feedback signals over a
period of time to produce modified phase differences
between the reference and feedback signals;
measuring the multiple phase errors between the reference
signal and the feedback signal, including, for each of the
phase errors, detecting a time when a phase error crossover time occurs, said phase error crossover time occurring when said phase error crosses over a preset value;
and
determining a value for the specified parameter using the
multitude of detected phase error crossover times; and
wherein:
the introducing multiple phase errors in the PLL includes
introducing multiple phase errors having opposite
polarities between the reference signal and the feedback
signal,
the detecting a time when a phase error crossover time
occurs includes using measurements of the crossover
times of a plurality of the introduced phase errors having
opposite polarities to overcome offsets in measurements
of the phase difference between the reference and feedback signals; and
the introducing multiple phase errors having opposite
polarities includes
alternating the polarities of successive ones of the multiple
phase errors, including
using a programmable divide to apply a plurality of divide
ratios to the feedback signal, and
applying a change divide ratio signal to a multiplexor to
control the multiplexor to select alternate ones of the
divide ratios for the programmable divide to apply to the
feedback signal to alternate the polarities of successive
ones of the multiple phase errors.

14. The method according to claim 13, wherein said phase errors are introduced repetitively in the PLL.

15. The method according to claim 14, wherein said phase errors are introduced in the PLL at regular periods.

16. The method according to claim 13, wherein the introducing multiple phase errors in said phase differences between the reference and feedback signals includes, over a given time period introducing a respective, one of the phase errors in the PLL a specified waiting time after each of the crossover times in said given period of time.

17. The method according to claim 13, wherein the PLL comprises a plurality of components, and the method further comprises using said determined value to adjust one or more of the components of the PLL.

18. A system for measuring a specified parameter in a phase-locked loop frequency synthesizer (PLL), wherein a reference signal is compared to a feedback signal to determine a phase difference between the reference and feedback signals, the system comprising:
a loop sensor for introducing multiple phase errors in the
PLL between the reference and feedback signals over a
period of time, and for measuring the multiple phase
errors between the reference signal and the feedback
signal, including, for each of the phase errors, detecting
a time when a phase error crossover time occurs, said
phase error crossover time occurring when the phase
error between the reference and feedback signals crosses
over a preset value; and
a processing unit for determining a value for the specified
parameter using the multitude of detected phase error
crossover times; and wherein:
the introducing multiple phase errors in the PLL includes
introducing multiple phase errors having opposite
polarities between the reference signal and the feedback
signal,
the detecting a time when a phase error crossover time
occurs includes using measurements of the crossover
times of a plurality of the introduced phase errors having
opposite polarities to overcome offsets in measurements
of the phase difference between the reference and feedback signals; and
the introducing multiple phase errors having opposite
polarities includes
alternating the polarities of successive ones of the multiple
phase errors, including
using a programmable divide to apply a plurality of divide
ratios to the feedback signal, and
applying a change divide ratio signal to a multiplexor to
control the multiplexor to select alternate ones of the
divide ratios for the programmable divide to apply to the
feedback signal to alternate the polarities of successive
ones of the multiple phase errors.

19. The system according to claim 18, wherein said loop sensor repetitively introduces said phase errors in the PLL.

20. The system according to claim 18, wherein the loop sensor introduces said phase errors in the PLL in said phase difference between the reference and feedback signals to produce modified phase differences between the reference and feedback signals.

21. The system according to claim 20, wherein:
the loop sensor measures a multitude of crossover times
when said modified phase differences cross over a preset
value; and the processing unit uses said multitude of measured crossover times to determine said value for the specified parameter.

* * * * *